(12) United States Patent
Li et al.

(10) Patent No.: US 11,031,974 B2
(45) Date of Patent: Jun. 8, 2021

(54) METHODS AND SYSTEMS FOR CONTROLLED COMMUNICATION IN WIRELESS CHARGING

(71) Applicant: Chengdu ConvenientPower Semiconductor Co., Ltd., Shenzhen (CN)

(72) Inventors: Tun Li, San Jose, CA (US); Siming Pan, San Jose, CA (US); Dawei He, Burlingame, CA (US); Tao Wang, Chengdu (CN)

(73) Assignee: CHENGDU CONVENIENTPOWER SEMICONDUCTOR CO. LTD., Shenzhen (CN)

( * ) Notice: Subject to any disclaimer, the term of this patent is extended or adjusted under 35 U.S.C. 154(b) by 0 days.

(21) Appl. No.: 16/680,373

(22) Filed: Nov. 11, 2019

(65) Prior Publication Data

US 2020/0153483 A1 May 14, 2020

Related U.S. Application Data

(60) Provisional application No. 62/760,205, filed on Nov. 13, 2018.

(51) Int. Cl.
*H04B 5/00* (2006.01)
*H04K 3/00* (2006.01)
(Continued)

(52) U.S. Cl.
CPC ............ *H04B 5/0037* (2013.01); *H02J 7/025* (2013.01); *H02J 50/12* (2016.02); *H02J 50/80* (2016.02);
(Continued)

(58) Field of Classification Search
CPC .. H04B 5/0037; H04B 5/0087; H04B 5/0075; H04B 5/0081; H04B 1/034; H04B 5/00
See application file for complete search history.

(56) References Cited

U.S. PATENT DOCUMENTS

| 2010/0151808 A1 | 6/2010 | Toncich et al. |
| 2013/0247194 A1 | 9/2013 | Jha et al. |

(Continued)

FOREIGN PATENT DOCUMENTS

| CN | 105262150 A | 1/2016 |
| CN | 108039894 A | 5/2018 |

OTHER PUBLICATIONS

Search Report and Written Opinion for International Application PCT/CN2019/116284, dated Feb. 3, 2020 (6 Pages).

*Primary Examiner* — Keith Ferguson
(74) *Attorney, Agent, or Firm* — Sheppard Mullin Richter & Hampton LLP

(57) ABSTRACT

A method is provided for controlling communication in wireless charging. The method comprises: controlling wireless power transfer with a device; receiving a communication signal from the device; generating a jamming signal based on the communication signal from the device; and applying the jamming signal to the communication signal to obtain a jammed communication signal. A device is also provided for controlling communication in wireless charging. The device is configured to control wireless power transfer and receive a communication signal. The device comprises: a jamming circuit configured to generate a jamming signal based on the received communication signal, wherein the device is further configured to apply the jamming signal to the received communication signal to obtain a jammed communication signal.

17 Claims, 10 Drawing Sheets

(51) Int. Cl.
*H02J 7/02* (2016.01)
*H02J 50/12* (2016.01)
*H02J 50/80* (2016.01)
*H03K 19/20* (2006.01)

(52) U.S. Cl.
CPC ............... *H04K 3/43* (2013.01); *H03K 19/20* (2013.01); *H04B 5/0075* (2013.01)

(56) References Cited

U.S. PATENT DOCUMENTS

2017/0294062 A1* 10/2017 Van Wiemeersch ........................ G07C 9/00309
2018/0090966 A1* 3/2018 Grover ................. H04B 5/0031
2019/0245389 A1* 8/2019 Johnston ................ H02J 50/05

* cited by examiner

METHODS AND SYSTEMS FOR CONTROLLED COMMUNICATION IN WIRELESS CHARGING

CROSS-REFERENCE TO RELATED APPLICATION

The present application claims the benefit of priority to U.S. Provisional Application No. 62/760,205, filed with the United States Patent and Trademark Office on Nov. 13, 2018, and entitled "METHODS AND SYSTEMS FOR CONTROLLED COMMUNICATION IN WIRELESS CHARGING," which is hereby incorporated by reference in its entirety.

TECHNICAL FIELD

The present disclosure relates generally to methods and systems for wirelessly charging, and more particularly, to methods and systems for controlled communication in wireless charging.

BACKGROUND

Communication in Wireless Power Transfer (also referred to as "WPT") systems may interfere with on-going communication in the other systems within a range. Such an interference is a big problem in wireless charging systems. For example, the interference of the WPT system with the other systems may cause failure in communication of the other systems.

SUMMARY

One aspect of the present disclosure is directed to a method for controlling communication in wireless charging. The method comprises: controlling wireless power transfer with a device; receiving a communication signal from the device; generating a jamming signal based on the communication signal from the device; and applying the jamming signal to the communication signal to obtain a jammed communication signal.

In some embodiments, the method further comprises: transmitting the jammed communication signal.

In some embodiments, the communication signal is generated under a modulation scheme, and the jammed communication signal is an invalid communication signal under the modulation scheme.

In some embodiments, generating a jamming signal based on the communication signal comprises: generating the jamming signal based on the modulation scheme of the communication signal.

In some embodiments, applying the jamming signal to the communication signal to obtain a jammed communication signal comprises: applying the jamming signal to the communication signal by a logic operation AND.

In some embodiments, applying the jamming signal to the communication signal to obtain a jammed communication signal comprises: applying the jamming signal to the communication signal by a logic operation OR.

In some embodiments, the jamming signal is at a same frequency as that of the communication signal.

Another aspect of the present disclosure is directed to a device for controlling communication in wireless charging. The device is configured to control wireless power transfer and receive a communication signal. The device comprises: a jamming circuit configured to generate a jamming signal based on the received communication signal. The device is further configured to apply the jamming signal to the received communication signal to obtain a jammed communication signal.

In some embodiments, the device comprises a power transmitter (PTx) configured to transmit power to another device.

In other embodiments, the device comprises a power receiver (PRx) configured to receive power from another device. In some embodiments, the PRx is configured to transmit or receive another communication signal.

In still other embodiments, the device comprises a buffer connecting two wireless power transfer systems. In some embodiments, the buffer comprises a wire, a capacitor or a battery.

In some embodiments, the communication signal is generated under a modulation scheme, and the jammed communication signal is an invalid communication signal under the modulation scheme.

In some embodiments, the jamming circuit is configured to generate the jamming signal based on the modulation scheme of the communication signal.

In some embodiments, the device is configured to apply the jamming signal to the communication signal by a logic operation AND or a logic operation OR.

Still another aspect of the present disclosure is directed to a circuit. The circuit comprises: a power inverter configured to receive an input direct current (DC) signal and transform the input DC signal to an alternating current (AC) signal; and a resonant tank connected to the power inverter, wherein the resonant tank is configured to obtain a jamming signal based on the AC signal, and the jamming signal is applicable to a communication signal to obtain a jammed communication signal.

In some embodiments, the resonant tank is further configured to obtain the jamming signal by picking out a signal at a frequency from the AC signal, and the frequency is the same as that of the communication signal.

In some embodiments, the circuit further comprises: a modulation component in front of the power inverter, wherein the modulation component is configured to apply the jamming signal to the communication signal.

In some embodiments, the modulation component comprises: an impedance; and a control component configured to control connection and disconnection of the impedance to apply the jamming signal to the communication signal.

Yet another aspect of the present disclosure is directed to a wireless charging device for controlled communication. The wireless charging device for controlled communication comprises a power transmitter (PTx) configured to transmit and receive a communication signal, wherein the PTx comprises a jamming circuit configured to generate and control a jamming signal, and wherein the PTx applies the jamming signal to the received communication signal to obtain a jammed communication signal.

Benefits of the present disclosure include: by applying a jamming signal to jam communication signals, the interference between Wireless Power Transfer (WPT) systems may be eliminated or at least reduced. The jamming signal may be obtained based on modulation scheme of communication signals, and thus can be used to convert the communication signals into invalid communication signals under the modulation scheme, thereby canceling the interference from the communication signals of one WPT system to the communication signals in another WPT system.

It is to be understood that the foregoing general description and the following detailed description are exemplary and explanatory only, and are not restrictive of the disclosure, as claimed.

BRIEF DESCRIPTION OF THE DRAWINGS

The accompanying drawings, which constitute a part of this disclosure, illustrate several embodiments and, together with the description, serve to explain the disclosed principles.

DETAILED DESCRIPTION

Figure 1:
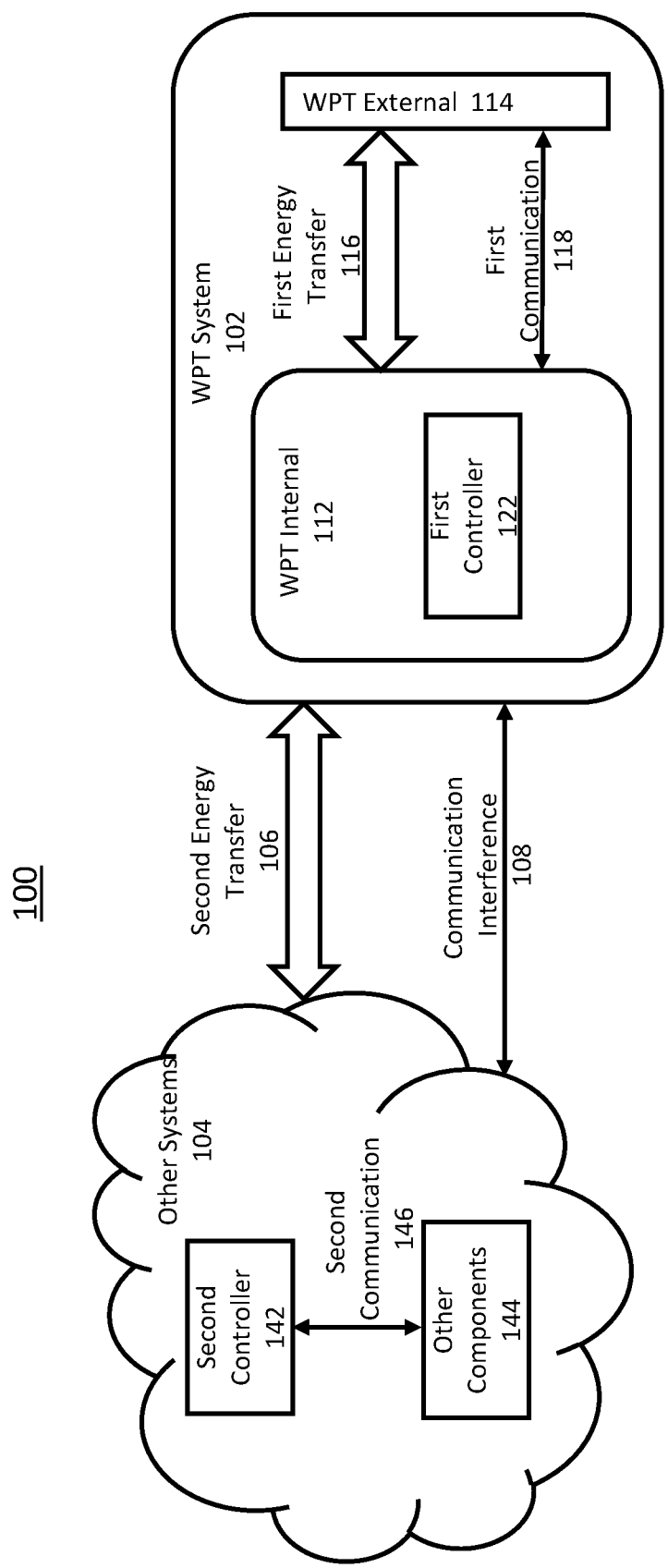
FIG. 1 is a graphical representation illustrating an environment for controlled communication in wireless charging, consistent with exemplary embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments consistent with the present disclosure do not represent all implementations consistent with the disclosure. Instead, they are merely examples of systems and methods consistent with aspects related to the disclosure.

In wireless charging systems, energy is transferred between power transmitter (also referred to as "PTx") and power receiver (also referred to as "PRx") through induction. In some embodiments, the power transmitter may be an electronic device or a component of an electronic device (e.g., a circuit) for transmitting power to another device. The power receiver may be an electronic device or a component of an electronic device (e.g., a circuit) for receiving power from another device. In some embodiments, a PTx and a PRx form a Wireless Power Transfer (also referred to as "WPT") system or a part of the WPT system.

In some embodiments, a wireless charging device may only contain one side of a Wireless Power Transfer ("WPT") system. A "WPT Internal" refers to an internal part (e.g., a hardware component, a software component, a combination of electronic hardware and computer software, etc.) of a device (e.g., a wireless charging device, or another electronic device, etc.) or a WPT system. A "WPT External" refers to an external part (e.g., a hardware component, a software component, a combination of electronic hardware and computer software, etc.) of a device (e.g., a wireless charging device, or another electronic device, etc.) or a WPT system. For example, a wireless charging device may include only a WPT Internal. In another example, a wireless charging device may include only a WPT External. In yet another example, a wireless charging device may include both a WPT Internal and a WPT External.

In some embodiments, if the device transmits energy, the WPT Internal of the device may include a PTx. A WPT External may include a PRx which receives energy. In some embodiments, if the device receives energy, then the WPT Internal may include a PRx, and the WPT External may include a PTx. In some embodiments, the WPT Internal and the WPT External form a WPT System.

In some embodiments, energy may be transferred between a WPT Internal and a WPT External. There may also be communication (e.g., wireless or wired) between the WPT Internal and the WPT External. For example, the communication between the WPT Internal and the WPT External can be achieved using different modulation methods, e.g., amplitude modulation, load modulation, phase modulation, frequency modulation, etc. In some embodiments, a WPT internal may also include a controller. The controller described hereinafter refers to the part of the device that controls the communication of the WPT internal. For example, the controller may control the generation of a communication signal. The controller may also transmit a communication signal and/or receive a communication signal to and/or from another device.

Outside the WPT System, there can be other systems within a range. In these other systems, energy may be transferred and communication signals may be transmitted and received. Therefore, interference may occur between the communication of the WPT system and that of the other systems. For example, the communication of the WPT system may interfere with the communication in the other systems. Without loss of generality, only interference of the WPT System with the other systems is discussed below. The source of the interference can be the WPT Internal or WPT External of the WPT system. For example, when the controller in the WPT Internal transmits communication signals, the source is the WPT Internal. If the controller in the WPT Internal receives communication signals from the WPT External, the source of the interference is the WPT External. Interference of the WPT system with the other systems can cause failure in communication of the other systems. The present disclosure provide methods to solve these issues. The methods may collectively or individually be referred to as controlled communication or controlling communication.

FIG. 1 is a graphical representation illustrating an environment 100 for controlled communication in wireless charging, consistent with exemplary embodiments of the present disclosure. As shown in FIG. 1, the environment 100 comprises a WPT system 102 and other systems 104. The WPT system 102 may include a WPT Internal 112 and a WPT External 114. The WPT Internal 112 and the WPT External 114 may transfer energy between each other (referred to as "first energy transfer" 116). The WPT Internal 112 and the WPT External 114 may also communicate with each other (referred to as "first communication" 118). The WPT Internal 112 may include a first controller 122 that is configured to transmit and receive communication signals to and from the WPT External 114.

As shown in FIG. 1, the WPT system 102 and other systems 104 may transfer energy between each other (referred to as "second energy transfer" 106). For example, the WPT system 102 may transfer energy to the other systems 104. The other systems 104 may be another WPT system, or other types of systems. The other systems 104 may include a second controller 142 that is configured to transmit and receive communication signals to and from other components 144, which is referred to as "second communication" 146. In some embodiments, there may be communication interference between the WPT system 102 and the other systems 104. For example, the first communication 118 in the WPT system 102 may interfere with the second communication 146 in the other systems 104.

In some embodiments, the first controller 122 transmits communication signals (first communication 118) in the WPT system 102. In other words, the WPT Internal 112 is the source of interference. The first communication 118 from the WPT system 102 interferes with the second communication 146 in the other systems 104. In some embodiments, to avoid the impact of interference from the first communication 118 to the second communication 146, the second controller 142 may take the following two actions to control the second communication 146: (1) the second controller 142 controls to conduct the second communication 146 (e.g., receive or transmit communication signals) when there is no interference from the first communication 118; (2) the second controller 142 commands the first controller 122 to stop the first communication 118 before the second controller 142 controls to conduct the second communication 146. For example, the second controller 142 can send a control command to the first controller 122.

In some embodiments, the first controller 122 receives communication signals (first communication 118) in the WPT system 102. In other words, the WPT External 114 is the source of interference. Again, the first communication 118 from the WPT system 102 interferes with the second communication 146 in the other systems 104. As the source of interference is the WPT External 114, it is difficult for the other systems 104 (through the second controller 142) to control when to start or stop the first communication 118 and to learn what the first communication 118 is, because the first controller 122 cannot control the timing or content of the first communication 118 or communication signals received from the WPT External 114. As a result, the first communication 118 can easily interfere with the second communication 146, and cause the second communication 146 to fail.

To solve this issue, a jamming signal may be added along an interference path from the WPT system 102 to the other systems 104. For example, the interference path may be from the source of the interference (e.g., the WPT External 114) to other components of the WPT system 102, and to components of the other systems 104 (including, e.g., the component receiving the second communication 146). In some embodiments, the jamming signal can be added on the WPT system 102 side, on the side of the other systems 104, or in the middle of the interference path.

FIGS. 2A-2D are graphical diagrams illustrating communication signals and a jamming signal, consistent with exemplary embodiments of the present disclosure. In the illustrated embodiments of FIGS. 2A-2D, the communication may be conducted with a differential bi-phase encoding scheme. The differential bi-phase encoding scheme may use the presence or absence of transitions to indicate logical value. In the differential bi-phase encoding scheme, signal significant conditions represent binary data, such as "a" and "1", and are represented as changes to succeeding values rather than with respect to a given reference.

Figure 2B:
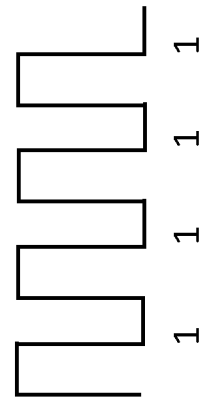
FIGS. 2A-2D are graphical diagrams of communication signals and a jamming signal, consistent with exemplary embodiments of the present disclosure.
Figure 2D:
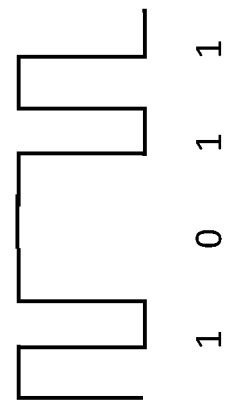
Figure 2A:
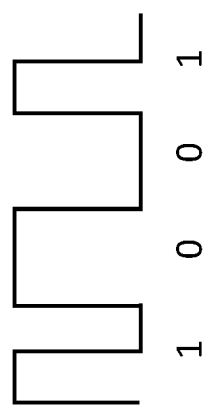
Figure 2C:
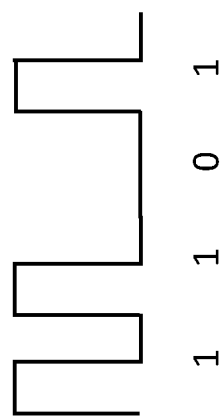

In the illustrated embodiments of FIGS. 2A-2D, the original communication signal (e.g., a signal in the first communication) is shown in FIG. 2A. As shown in FIG. 2A, the original communication signal has 4 bits, and represents "1001." An exemplary jamming signal is shown FIG. 2B. For example, the jamming signal represents "1111." If the jamming signal is added to original signal by logic operation "AND," then the resulting signal is "1101," as shown in FIG. 2C. If the jamming signal is added to the original signal by logic operation "OR," then the resulting signal is "1011," as shown in FIG. 2D. Neither of the resulting signals in FIG. 2C and FIG. 2D represents a valid communication signal under the differential bi-phase encoding scheme. Therefore, the resulting signals in FIG. 2C and FIG. 2D are jammed, referred to as "jammed communication signals." Although the jammed communication signals can still be received and observed by the other systems, they are not valid communication signals and not understandable by the receiving components, or cannot be correctly demodulated by the receiving components, thereby causing no interference with other communication. Therefore, by adding a jamming signal to the first communication, the second communication is not interfered by the first communication.

Although only one example of the jamming signal is shown in FIGS. 2A-2D, many other examples of the jamming signal may be used to achieve the same or similar effect as described above. Those skilled in the related art should appreciate that other types or other examples of the jamming signals may be selected according to requirements of various scenarios. Further, operation types by which the jamming signal is applied to the communication signals may not limited to the above-described logic operations "AND" and "OR." Other logic operations may be used to apply to the jamming signal to the communication signals.

Figure 3:
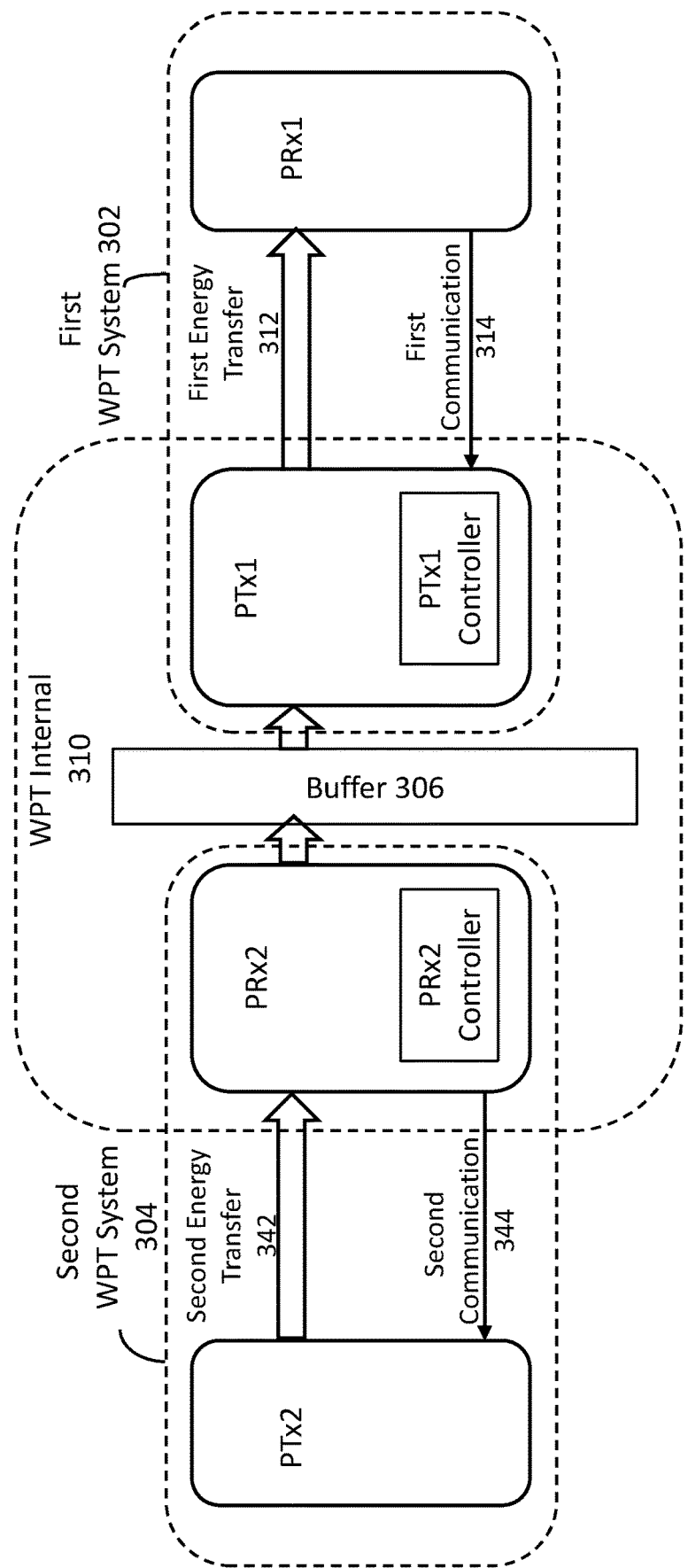
FIG. 3 is a diagram illustrating two Wireless Power Transfer (WPT) systems where controlled communication may be applied to reduce interference between the two WPT systems, consistent with exemplary embodiments of the present disclosure.

One exemplary application of the jamming signal may be the use in two connected WPT systems. FIG. 3 is a diagram illustrating two WPT systems where controlled communication may be applied to reduce interference between the two WPT systems, consistent with exemplary embodiments of the present disclosure. As shown in FIG. 3, a first WPT system 302 includes a Power Transmitter 1 ("PTx1") and a Power Receiver 1 ("PRx1"), and a second WPT system 304 includes a Power Transmitter 2 ("PTx2") and a Power Receiver 2 ("PRx2"). The two WPT systems 302, 304 are connected to each other through a buffer 306. For example, the buffer 306 between the PRx2 and the PTx1 can be a simple wire connection, or some energy buffer such as a capacitor or battery.

In the illustrated embodiments of FIG. 3, there are first communication 314 in the first WPT system 302, and second communication 344 in the second WPT system 304. For example, the PTx1 may include a PTx1 controller that controls the first communication 314 in the first WPT system 302, and the PRx2 may include a PRx2 controller to control the second communication 344 in the second WPT system 304. The PTx1 (or the PTx1 controller) receives the first communication 314, while the PRx2 (or the PRx2 controller) transmits the second communication 344. The first and second communication 314, 344 may be conducted through load modulation. However, any other types of modulation can also be used. As shown in FIG. 3, energy may flow from the PTx2 to the PRx2 (referred to as "second energy transfer" 342) through a wireless connection, then from the PRx2 to the PTx1 through a wired connection (buffer 306), and from the PTx1 to the PRx1 (referred to as "first energy transfer" 312) through another wireless connection. The PRx2, PTx1 and the buffer 306 altogether form the WPT Internal 310 or a device 310.

Figure 4:
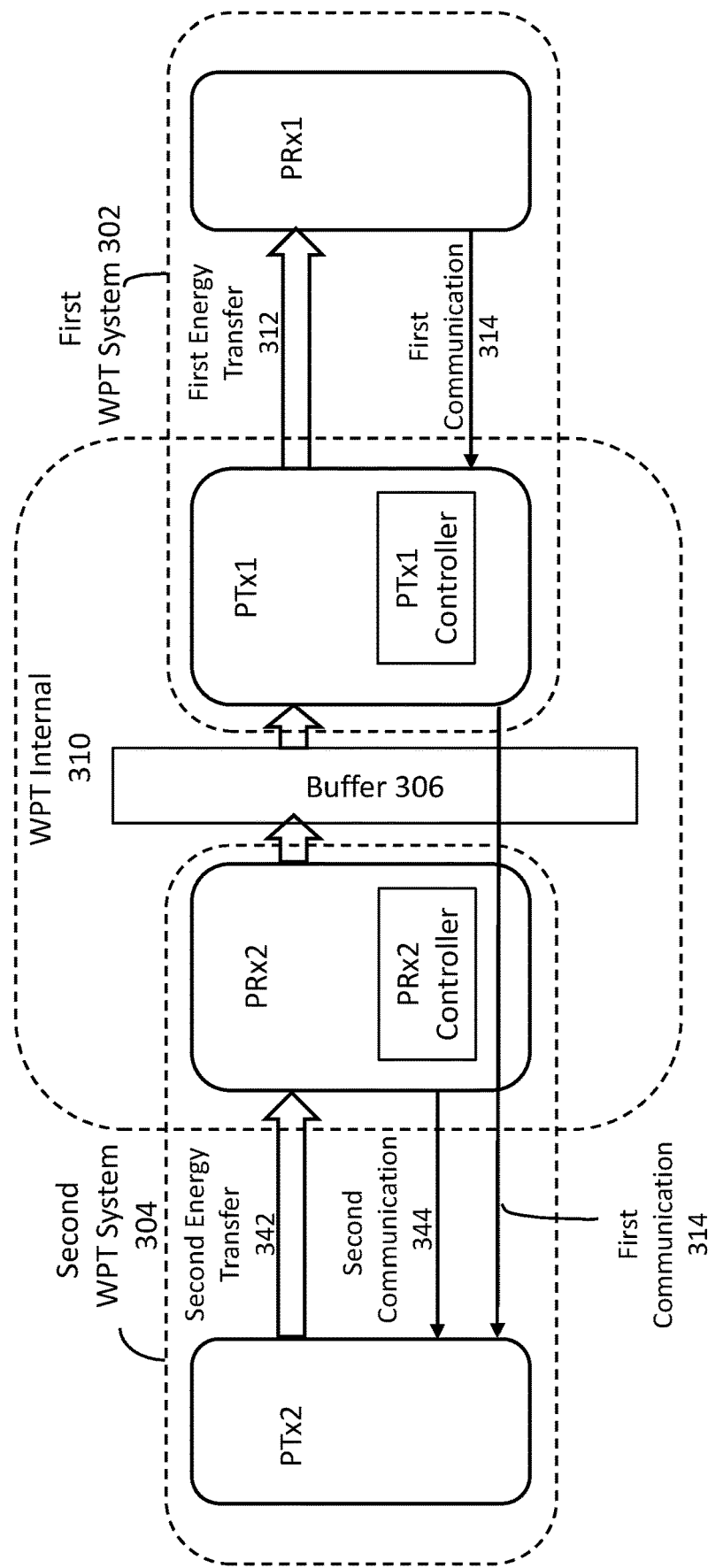
FIG. 4 is a diagram illustrating the interference between the two WPT systems in FIG. 3, consistent with exemplary embodiments of the present disclosure.

FIG. 4 is a diagram illustrating the interference between the two WPT systems 302, 304 in FIG. 3, consistent with exemplary embodiments of the present disclosure. As shown in FIG. 4, the interference between the two WPT systems 302, 304 may occur in two scenarios as introduced above. First, there can be interference of the second communication 344 with the first communication 314. In such a scenario, the second WPT system 304 corresponds to the WPT system 102 in FIG. 1, and the first WPT system 302 corresponds to the other systems 104 in FIG. 1. Thus, the PRx2 controller is equivalent to the first controller 122 in FIG. 1, while the PTx1 controller is equivalent to the second controller 142 in FIG. 1. As PRx2 controller is the source of interference, to avoid interference from the second communication 344 to the first communication 314, the PTx1 controller can take following actions: the PTx1 controller controls to receive the first communication 314 when there is no interference from the second communication 344; the PTx1 controller commands the PRx2 controller to stop the second communication 344 before the PTx1 controller controls to receive the first communication 314. For example, the PTx1 controller can send a control command to the PRx2 controller.

Second, there can be interference of the first communication 314 with the second communication 344. In such a scenario, the first WPT system 302 is equivalent to the WPT system 102 in FIG. 1, and the second WPT system 304 is equivalent to the other systems 104 in FIG. 1. The PTx1 controller corresponds to the first controller 122 in FIG. 1, while the PRx2 controller corresponds to the second controller 142 in FIG. 1. As the PTx1 controller only receives the first communication signals in the first communication 314, the PTx1 controller is not the source of interference and PRx1 is the source of interference. As shown in FIG. 4, the first communication signals are transmitted from the PRx1 to the PTx1 within the first WPT system 302. Without adding any jamming signals, the first communication signals can be received and demodulated by the other systems, e.g., the second WPT system 304 or the PTx2 in the second WPT system 304. As the PTx2 also receives the second communication signals in the second communication 344 from the PRx2, the first communication signals can interfere with the received second communication signals, thereby disturbing stability of the second WPT system 304.

Figure 5A:
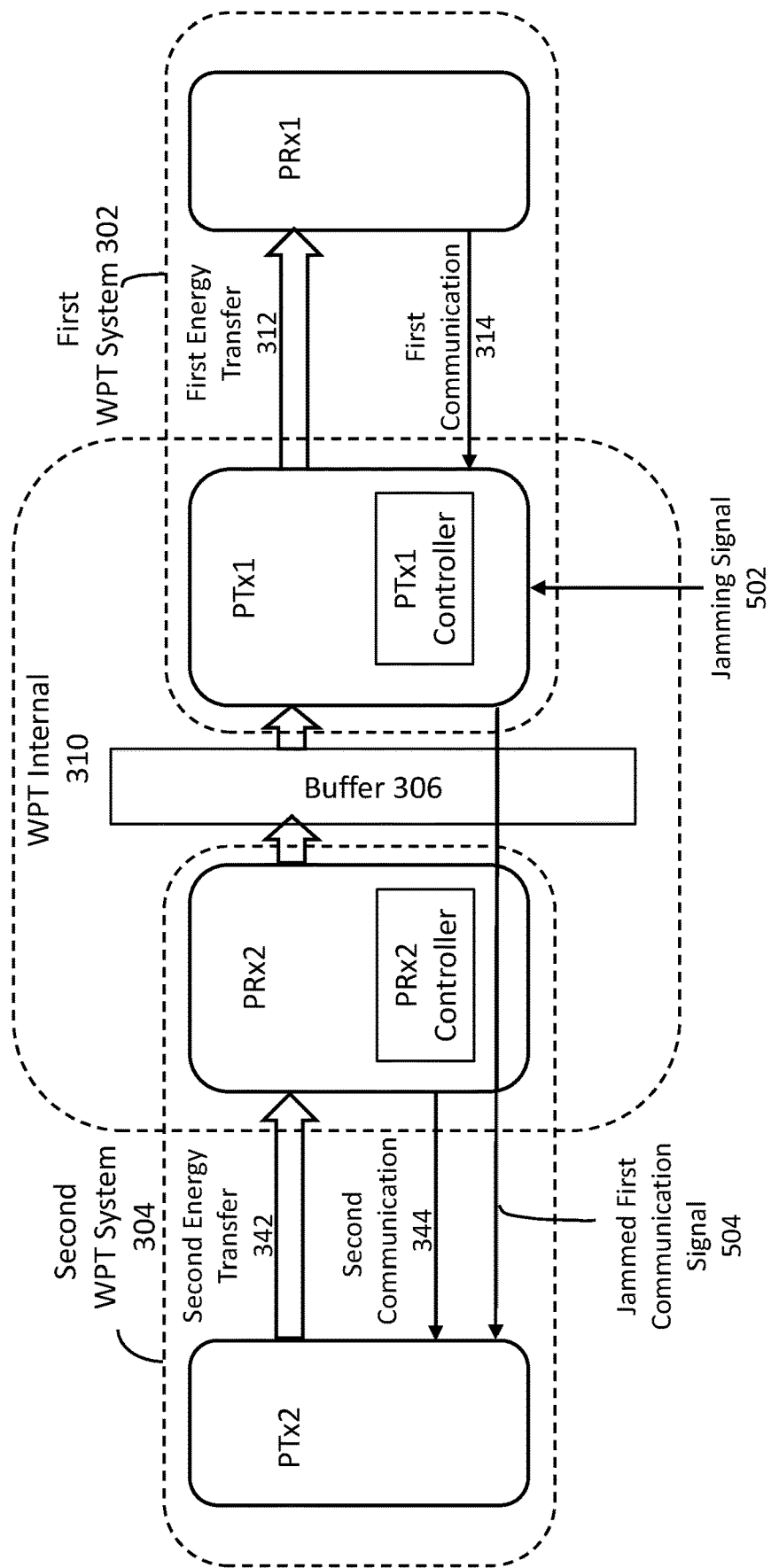
FIGS. 5A-5C are diagrams illustrating controlling communication between the two WPT systems by adding a jamming signal to reduce interference between them, consistent with exemplary embodiments of the present disclosure.
Figure 5B:
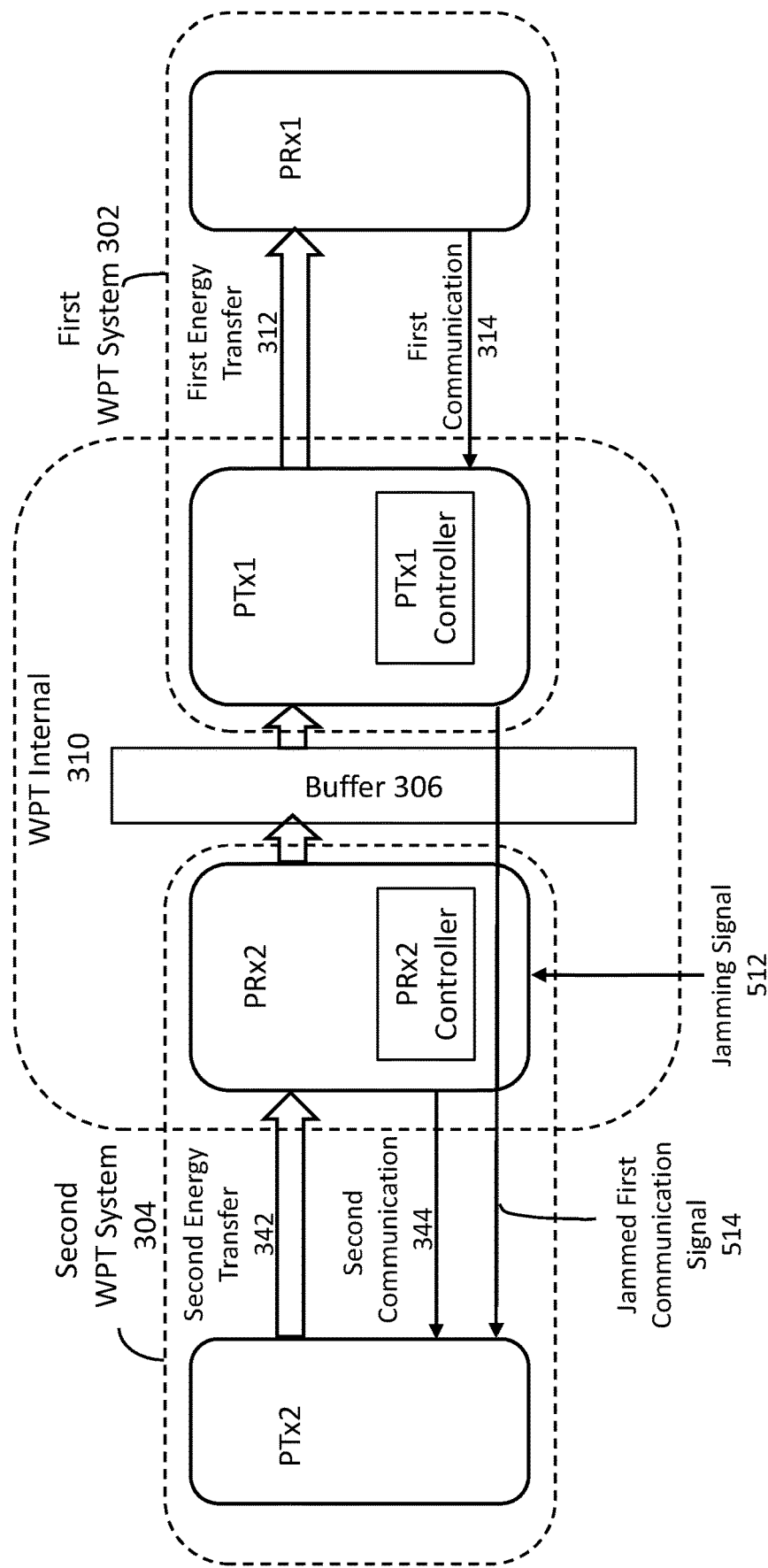
Figure 5C:
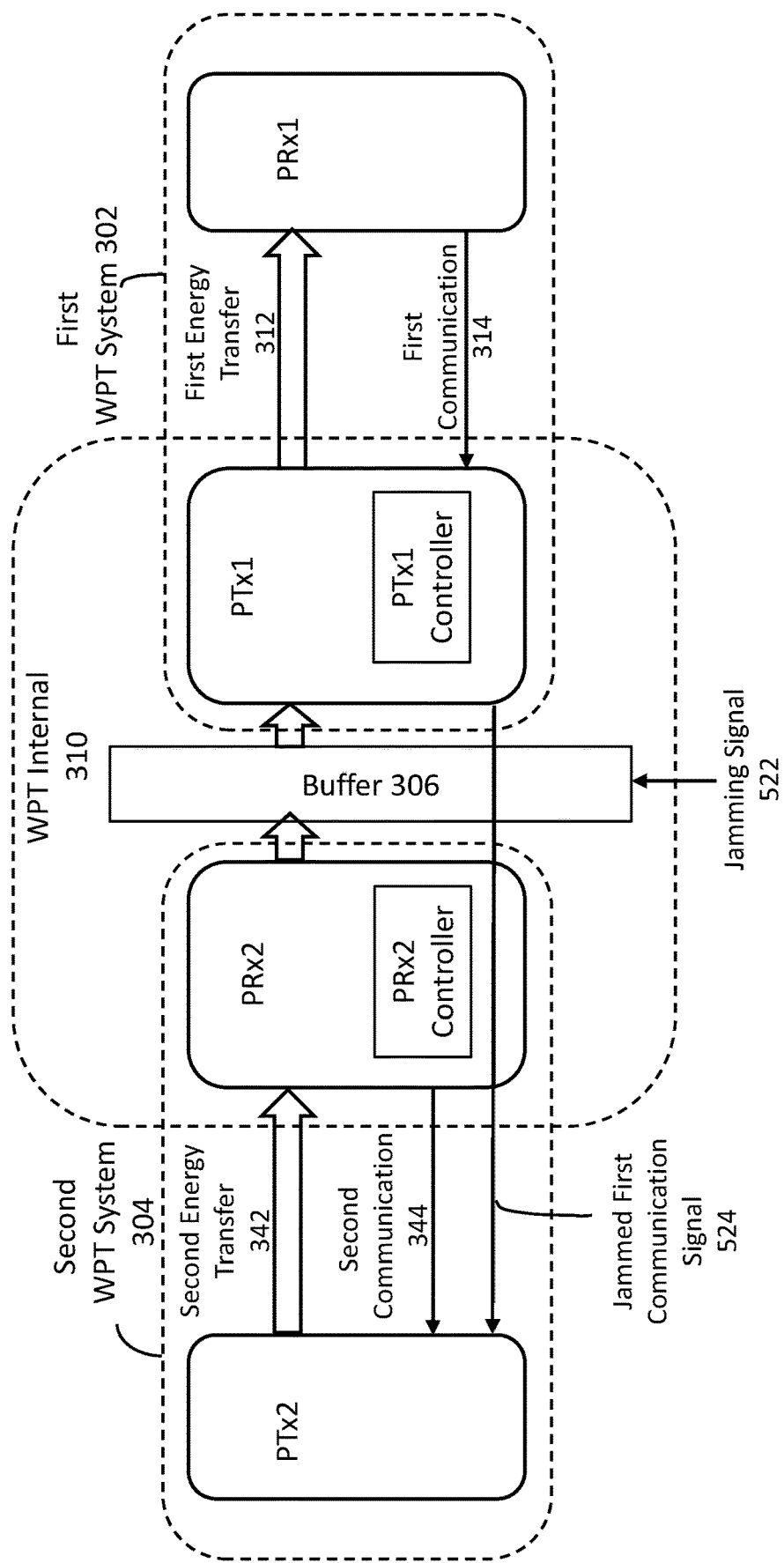

FIGS. 5A-5C are diagrams illustrating controlling communication between the two WPT systems by adding a jamming signal to reduce interference between them, consistent with exemplary embodiments of the present disclosure. As shown in FIGS. 5A-5C, to jam the communication signals of the first WPT system 302 observed by the second WPT system 304, a jamming signal 502 can be applied by the PTx1, the PRx2, or the buffer 306 to first communication signals in the first communication 314 to obtain jammed first communication signals 504. Subsequently, even if the second WPT system 304 receives the jammed first communication signals 504, since the jammed first communication signals 504 are not valid communication signals, they cannot be correctly demodulated and thus do not interfere with the second communication signals received by the second WPT system 304. Therefore, the second WPT system 304 can have a stable communication without interference from the first WPT system 302.

In the illustrated embodiments of FIG. 5A, a jamming signal 502 is applied by the PTx1 on the received first communication signals to obtain jammed first communication signals 504. For example, the PTx1 receives first communication signals from the PRx1. The PTx1 may generate a jamming signal 502, e.g., the example jamming signal shown in FIG. 2B. In some embodiments, the PTx1 may generate a jamming signal 502 based on a first communication signal or the modulation of the first communication signal. Further, the PTx1 may apply the jamming signal 502 to the received first communication signals. For example, the PTx1 may add the jamming signal 502 to the received first communication signals by logic operation "AND," or by logic operation "OR." Thus, jammed first communication signals 504 may be obtained. Although the jammed first communication signals 504 may be transmitted to the PTx2 in the second WPT system 304, they do not interfere with the second communication signals as they are not valid communication signals, and cannot be correctly demodulated by the PTx2.

In the illustrated embodiments of FIG. 5B, a jamming signal 512 is applied by the PRx2 on the received first communication signals to obtain jammed first communication signals 514. For example, the PRx2 receives first communication signals from the first WPT system 302 (e.g., from the PRx1). The PRx2 may generate a jamming signal 512, e.g., the example jamming signal shown in FIG. 2B. In some embodiments, the PRx2 may generate a jamming signal 512 based on a first communication signal or the modulation of the first communication signal. Similar to the embodiments of FIG. 5A, the PRx2 may apply the jamming signal 512 to the received first communication signals by adding the jamming signal 512 to the received first communication signals through logic operation "AND," or through logic operation "OR," to obtain jammed first communication signals 514. When the PTx2 receives the jammed first communication signals 514, the jammed first communication signals 514 do not interfere with the second communication signals as the jammed first communication signals 514 cannot be correctly demodulated by the PTx2.

In the illustrated embodiments of FIG. 5C, the buffer 306 may apply a jamming signal 522 to the received first communication signals to obtain jammed first communication signals 524. Therefore, when the PTx2 receives the jammed first communication signals 524, the jammed first communication signals 524 do not interfere with the second communication signals as the jammed first communication signals 524 cannot be correctly demodulated by the PTx2. In some embodiments, the buffer 306 may generate a jamming signal 522, e.g., the example jamming signal shown in FIG. 2B. In some embodiments, the buffer 306 may generate a jamming signal 522 based on a first communication signal or the modulation of the first communication signal. Similar to the embodiments of FIGS. 5A and 5B, the buffer 306 may apply the jamming signal 522 to the received first communication signals by adding the jamming signal 522 to the received first communication signals through logic operation "AND," or through logic operation "OR," to obtain jammed first communication signals 524.

Figure 6:
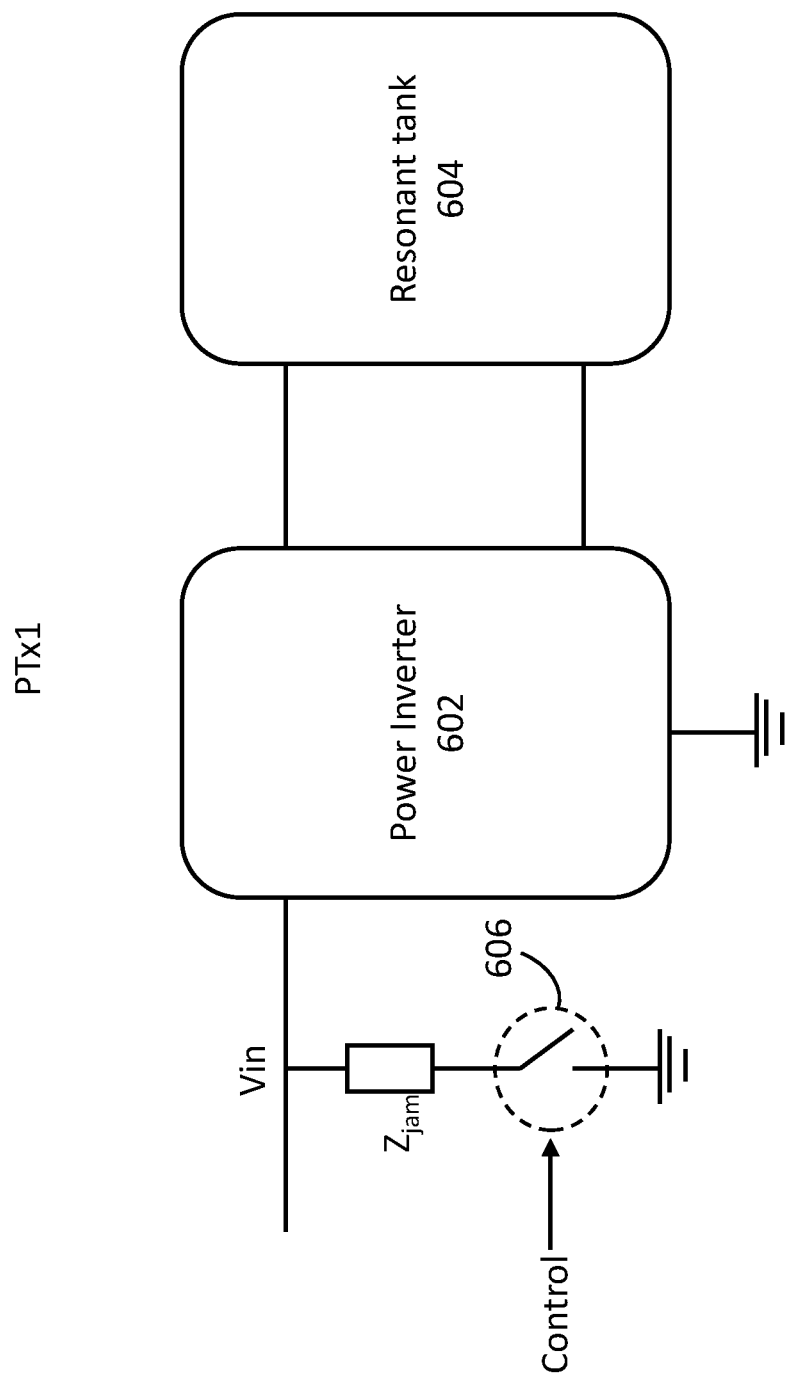
FIG. 6 is a diagram illustrating an exemplary jamming circuit, consistent with exemplary embodiments of the present disclosure.

FIG. 6 is a diagram illustrating an exemplary jamming circuit, consistent with exemplary embodiments of the present disclosure. For example, the exemplary jamming circuit shown in FIG. 6 may be used in the embodiments of FIG. 5A. As the jamming signal 502 is applied in the PTx1 in FIG. 5A, only a part of the PTx1 is shown in FIG. 6. As shown in FIG. 6, the jamming circuit may include a power inverter 602, a resonant tank 604, an impedance $Z_{jam}$ and its control component 606 (e.g., a switch). The power inverter 602 may be configured to receive an input direct current (DC) power signal (e.g., represented by a voltage "Vin") and transform the input DC power signal into an alternating current (AC) power signal. The AC power signal may be transmitted to the resonant tank 604. The resonant tank 604 may be configured to either generate signals at a preset frequency (e.g., generate a jamming signal at a frequency), or to pick out a signal at a frequency from a more complex signal (e.g., pick out a jamming signal at a frequency from the AC power signal). In some embodiments, the jamming signal has the same frequency as that of the first communication signals. In some embodiments, the AC power signal can be captured by the PRx1 (not shown in FIG. 6) through inductive coupling.

Given that the first communication signals may be transmitted from the PRx1 to the PTx1 through load modulation, to apply the jamming signal to the first communication signals, a modulation circuit may be added in front of the power inverter 602 (e.g., the module circuit may include the impedance $Z_{jam}$ and the switch 606). For example, when a first communication signal is detected, the Px1 controller applies the jamming signal by controlling the connection and disconnection of an impedance $Z_{jam}$ through a switch 606.

Those skilled in the art should recognize that the embodiments illustrated in FIG. 6 do not limit other ways or embodiments for applying a jamming signal. Furthermore, methods similar to those in FIG. 6 may be used for the embodiments shown in FIGS. 5B and 5C.

Figure 7:
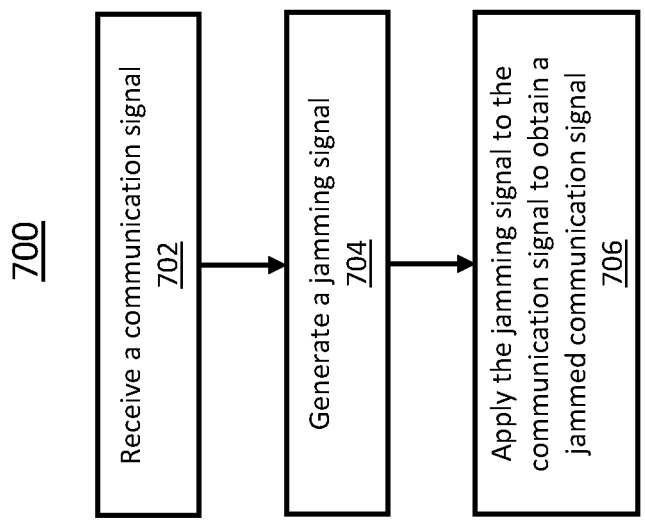
FIG. 7 is a flowchart illustrating a method for controlling communication in wireless charging, consistent with exemplary embodiments of the present disclosure.

FIG. 7 is a flowchart illustrating a method for controlled communication in wireless charging, consistent with exemplary embodiments of the present disclosure. Method 700 may include a number of steps, some of which may be optional. The steps may also be rearranged in another order. For example, steps 702 and 704 may be performed in either order or concurrently.

In Step 702, a communication signal may be received. For example, a wireless charging device (e.g., the WPT Internal as shown in FIGS. 5A-5C) may receive a communication signal. In Step 704, a jamming signal may be generated. For example, the wireless charging device may generate a jamming signal of the same frequency as that of the communication signal. For example, the wireless charging device may include a jamming circuit as shown in FIG. 6 that generates a jamming signal of the same frequency as that of the communication signal as described above with reference to FIG. 6. In Step 706, the jamming signal may be applied to the communication signal to obtain a jammed communication signal. For example, the jamming signal may be added to the communication signal through a logic operation "AND" or "OR." Therefore, a jammed communication signal may be obtained, which is void to the receiving devices (e.g., other devices which also perform communications within the devices).

Another aspect of the disclosure is directed to a non-transitory computer-readable storage medium storing instructions which, when executed, cause one or more processors to perform the method, as discussed above. The computer-readable storage medium may include volatile or non-volatile, magnetic, semiconductor, tape, optical, removable, non-removable, or other types of computer-readable storage medium or computer-readable storage devices. For example, the computer-readable storage medium may be the storage unit or the memory module having the computer instructions stored thereon, as disclosed. In some embodiments, the computer-readable storage medium may be a disc or a flash drive having the computer instructions stored thereon.

Figure 8:
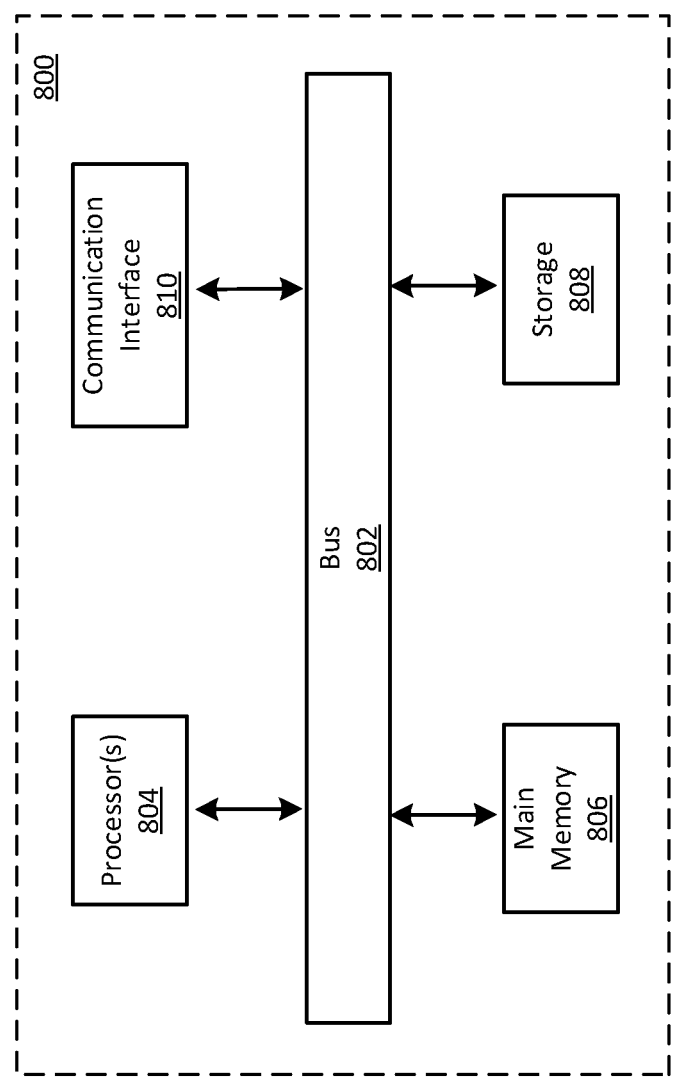
FIG. 8 is a block diagram of a computer system that can be used to implement the embodiments described in the specification.

FIG. 8 is a block diagram that illustrates a computer system 800 upon which any of the embodiments described herein may be implemented. The computer system 800 includes a bus 802 or other communication mechanism for communicating information, one or more hardware processors 804 coupled with bus 802 for processing information. Hardware processor(s) 804 may be, for example, one or more general purpose microprocessors.

The computer system 800 also includes a main memory 806, such as a random access memory (RAM), cache and/or other dynamic storage devices, coupled to bus 802 for storing information and instructions to be executed by processor(s) 804. Main memory 806 also may be used for storing temporary variables or other intermediate information during execution of instructions to be executed by processor(s) 804. Such instructions, when stored in storage media accessible to processor(s) 804, render computer system 800 into a special-purpose machine that is customized to perform the operations specified in the instructions.

The computer system 800 may implement the techniques described herein using customized hard-wired logic, one or more ASICs or FPGAs, firmware and/or program logic which in combination with the computer system causes or programs computer system 800 to be a special-purpose machine. According to one embodiment, the techniques herein are performed by computer system 800 in response to processor(s) 804 executing one or more sequences of one or more instructions contained in main memory 806. Such instructions may be read into main memory 806 from another storage medium, such as storage device 808. Execution of the sequences of instructions contained in main memory 806 causes processor(s) 804 to perform the process steps described herein. In alternative embodiments, hard-wired circuitry may be used in place of or in combination with software instructions.

The computer system 800 also includes a communication interface 810 coupled to bus 802. Communication interface 810 provides a two-way data communication coupling to one or more network links that are connected to one or more networks. As another example, communication interface 810 may be a local area network (LAN) card to provide a data communication connection to a compatible LAN (or WAN component to communicated with a WAN). Wireless links may also be implemented.

A person skilled in the art can further understand that, various exemplary logic blocks, modules, circuits, and algorithm steps described with reference to the disclosure herein may be implemented as specialized electronic hardware, computer software, or a combination of electronic hardware and computer software. For examples, the modules/units may be implemented by one or more processors to cause the one or more processors to become one or more special purpose processors to executing software instructions stored in the computer-readable storage medium to perform the specialized functions of the modules/units.

The flowcharts and block diagrams in the accompanying drawings show system architectures, functions, and operations of possible implementations of the system and method according to multiple embodiments of the present disclosure. In this regard, each block in the flowchart or block diagram may represent one module, one program segment, or a part of code, where the module, the program segment, or the part of code includes one or more executable instructions used for implementing specified logic functions. It should also be noted that, in some alternative implementations, functions marked in the blocks may also occur in a sequence different from the sequence marked in the drawing. For example, two consecutive blocks actually can be executed in parallel substantially, and sometimes, they can also be executed in reverse order, which depends on the functions involved. Each block in the block diagram and/or flowchart, and a combination of blocks in the block diagram and/or flowchart, may be implemented by a dedicated hardware-based system for executing corresponding functions or operations, or may be implemented by a combination of dedicated hardware and computer instructions.

As will be understood by those skilled in the art, embodiments of the present disclosure may be embodied as a method, a system or a computer program product. Accordingly, embodiments of the present disclosure may take the form of an entirely hardware embodiment, an entirely software embodiment or an embodiment combining software and hardware for allowing specialized components to perform the functions described above. Furthermore, embodiments of the present disclosure may take the form of a computer program product embodied in one or more tangible and/or non-transitory computer-readable storage media containing computer-readable program codes. Common forms of non-transitory computer readable storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

Embodiments of the present disclosure are described with reference to flow diagrams and/or block diagrams of methods, devices (systems), and computer program products according to embodiments of the present disclosure. It will be understood that each flow and/or block of the flow diagrams and/or block diagrams, and combinations of flows and/or blocks in the flow diagrams and/or block diagrams, can be implemented by computer program instructions. These computer program instructions may be provided to a processor of a computer, an embedded processor, or other programmable data processing devices to produce a special purpose machine, such that the instructions, which are executed via the processor of the computer or other programmable data processing devices, create a means for implementing the functions specified in one or more flows in the flow diagrams and/or one or more blocks in the block diagrams.

These computer program instructions may also be stored in a computer-readable memory that can direct a computer or other programmable data processing devices to function in a particular manner, such that the instructions stored in the computer-readable memory produce a manufactured product including an instruction means that implements the functions specified in one or more flows in the flow diagrams and/or one or more blocks in the block diagrams.

These computer program instructions may also be loaded onto a computer or other programmable data processing devices to cause a series of operational steps to be performed on the computer or other programmable devices to produce processing implemented by the computer, such that the instructions (which are executed on the computer or other programmable devices) provide steps for implementing the functions specified in one or more flows in the flow diagrams and/or one or more blocks in the block diagrams. In a typical configuration, a computer device includes one or more Central Processing Units (CPUs), an input/output interface, a network interface, and a memory. The memory may include forms of a volatile memory, a random access memory (RAM), and/or non-volatile memory and the like, such as a read-only memory (ROM) or a flash RAM in a computer-readable storage medium. The memory is an example of the computer-readable storage medium.

The computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The computer-readable medium includes non-volatile and volatile media, and removable and non-removable media, wherein information storage can be implemented with any method or technology. Information may be modules of computer-readable instructions, data structures and programs, or other data. Examples of a non-transitory computer-readable medium include but are not limited to a phase-change random access memory (PRAM), a static random access memory (SRAM), a dynamic random access memory (DRAM), other types of random access memories (RAMs), a read-only memory (ROM), an electrically erasable programmable read-only memory (EEPROM), a flash memory or other memory technologies, a compact disc read-only memory (CD-ROM), a digital versatile disc (DVD) or other optical storage, a cassette tape, tape or disk storage or other magnetic storage devices, a cache, a register, or any other non-transmission media that may be used to store information capable of being accessed by a computer device. The computer-readable storage medium is non-transitory, and does not include transitory media, such as modulated data signals and carrier waves.

The specification has described methods, apparatus, and systems for controlled communication in wireless electrical charging. The illustrated steps are set out to explain the exemplary embodiments shown, and it should be anticipated that ongoing technological development will change the manner in which particular functions are performed. Thus, these examples are presented herein for purposes of illustration, and not limitation. For example, steps or processes disclosed herein are not limited to being performed in the order described, but may be performed in any order, and some steps may be omitted, consistent with the disclosed embodiments. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments.

While examples and features of disclosed principles are described herein, modifications, adaptations, and other implementations are possible without departing from the spirit and scope of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

It will be appreciated that the present disclosure is not limited to the exact construction that has been described above and illustrated in the accompanying drawings, and that various modifications and changes can be made without departing from the scope thereof. It is intended that the scope of the disclosure should only be limited by the appended claims.

What is claimed is:

1. A method for controlling communication in wireless charging, the method comprising:
controlling wireless power transfer with a device;
receiving a communication signal from the device;
generating a jamming signal based on the communication signal from the device; and
applying the jamming signal to the communication signal to obtain a jammed communication signal,
wherein the communication signal is generated under a modulation scheme, and the jammed communication signal is an invalid communication signal under the modulation scheme.

2. The method of claim 1, further comprising:
transmitting the jammed communication signal.

3. The method of claim 1, wherein generating a jamming signal based on the communication signal comprises:
generating the jamming signal based on the modulation scheme of the communication signal.

4. The method of claim 1, wherein applying the jamming signal to the communication signal to obtain a jammed communication signal comprises:
applying the jamming signal to the communication signal by a logic operation AND.

5. The method of claim 1, wherein applying the jamming signal to the communication signal to obtain a jammed communication signal comprises:
applying the jamming signal to the communication signal by a logic operation OR.

6. The method of claim 1, wherein the jamming signal is at a same frequency as that of the communication signal.

7. A device for controlling communication in wireless charging, the device configured to control wireless power transfer and receive a communication signal, and the device comprising:
a jamming circuit configured to generate a jamming signal based on the received communication signal,
wherein the device is further configured to apply the jamming signal to the received communication signal to obtain a jammed communication signal,
wherein the communication signal is generated under a modulation scheme, and the jammed communication signal is an invalid communication signal under the modulation scheme.

8. The device of claim 7, wherein the device comprises a power transmitter (PTx) configured to transmit power to another device.

9. The device of claim 7, wherein the device comprises a power receiver (PRx) configured to receive power from another device.

10. The device of claim 9, wherein the PRx is configured to transmit or receive another communication signal.

11. The device of claim 7, wherein the device comprises a buffer connecting two wireless power transfer systems.

12. The device of claim 11, wherein the buffer comprises a wire, a capacitor or a battery.

13. The device of claim 7, wherein the jamming circuit is configured to generate the jamming signal based on the modulation scheme of the communication signal.

14. The device of claim 7, wherein the device is configured to apply the jamming signal to the communication signal by a logic operation AND or a logic operation OR.

15. A device for controlling communication in wireless charging, the device configured to control wireless power transfer and receive a communication signal, and the device comprising:
a jamming circuit configured to generate a jamming signal based on the received communication signal,
wherein the device is further configured to apply the jamming signal to the received communication signal to obtain a jammed communication signal,
wherein the device comprises a power receiver (PRx) configured to receive power from another device and to transmit or receive another communication signal, the device is configured to apply the jamming signal to the communication signal by a logic operation AND or a logic operation OR.

16. The device of claim 15, wherein the device comprises a buffer connecting two wireless power transfer systems.

17. The device of claim 16, wherein the buffer comprises a wire, a capacitor or a battery.

* * * * *

Disclaimer

11,031,974 B2 - Tun Li; Siming Pan, both of San Jose, CA (US); Dawei He, Burlingame, CA (US); Tao Wang, Chengdu (CN). METHODS AND SYSTEMS FOR CONTROLLED COMMUNICATION IN WIRELESS CHARGING. Patent dated June 8, 2021. Disclaimer filed February 7, 2024, by the assignee, Chengdu ConvenientPower Semiconductor Co., Ltd.

I hereby disclaim the entire term of said patent.

*(Official Gazette, May 7, 2024)*